(12) United States Patent
Chen et al.

(10) Patent No.: US 7,498,235 B2
(45) Date of Patent: Mar. 3, 2009

(54) METHOD FOR FABRICATING SIGE-ON-INSULATOR (SGOI) AND GE-ON-INSULATOR (GOI) SUBSTRATES

(75) Inventors: Tze-chiang Chen, Yorktown Heights, NY (US); Guy M. Cohen, Mohegan Lake, NY (US); Alexander Reznicek, Mount Kisco, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/924,207

(22) Filed: Oct. 25, 2007

(65) Prior Publication Data
US 2008/0050887 A1    Feb. 28, 2008

Related U.S. Application Data

(62) Division of application No. 11/481,525, filed on Jul. 6, 2006, now Pat. No. 7,315,065, which is a division of application No. 10/700,085, filed on Nov. 3, 2003, now Pat. No. 7,084,460.

(51) Int. Cl.
*H01L 21/30*    (2006.01)

(52) U.S. Cl. ............... 438/455; 438/118; 438/406; 257/19; 257/E21.088

(58) Field of Classification Search ............... 259/19; 438/455, 118, 406; 257/E21.088, E21.122
See application file for complete search history.

(56) References Cited

U.S. PATENT DOCUMENTS

| 5,906,951 | A | 5/1999 | Chu et al. |
| 6,633,066 | B1 | 10/2003 | Bae et al. |
| 6,677,655 | B2 | 1/2004 | Fitzergald |
| 6,989,058 | B2 * | 1/2006 | Bedell et al. ............ 117/4 |
| 7,005,676 | B2 * | 2/2006 | Tezuka et al. ............ 257/65 |
| 2004/0137698 | A1 * | 7/2004 | Taraschi et al. ............ 438/458 |

\* cited by examiner

*Primary Examiner*—Quoc D Hoang
(74) *Attorney, Agent, or Firm*—Scully, Scott, Murphy & Presser, P.C.; Robert M. Trepp, Esq.

(57) ABSTRACT

A method for fabricating germanium-on-insulator (GOI) substrate materials, the GOI substrate materials produced by the method and various structures that can include at least the GOI substrate materials of the present invention are provided. The GOI substrate material include at least a substrate, a buried insulator layer located atop the substrate, and a Ge-containing layer, preferably pure Ge, located atop the buried insulator layer. In the GOI substrate materials of the present invention, the Ge-containing layer may also be referred to as the GOI film. The GOI film is the layer of the inventive substrate material in which devices can be formed.

10 Claims, 6 Drawing Sheets

METHOD FOR FABRICATING SIGE-ON-INSULATOR (SGOI) AND GE-ON-INSULATOR (GOI) SUBSTRATES

RELATED APPLICATIONS

This application is a divisional of U.S. application Ser. No. 11/481,525, filed Jul. 6, 2006, which is a divisional of U.S. application Ser. No. 10/700,085, filed Nov. 3, 2003.

DESCRIPTION

1. Field of the Invention

The present invention relates to semiconductor substrate materials, and more particularly to germanium-on-insulator (GOI) substrate materials, and to a method of forming GOI substrate materials as well as silicon germanium-on-insulator (SGOI) substrate materials. The present invention also relates to semiconductor structures that include at least the GOI substrate material of the present invention.

2. Background of the Invention

In the semiconductor industry, it is well known that germanium (Ge) has higher carrier mobility than silicon (Si) for both electrons and holes. Despite having higher carrier mobility, Ge substrates are not currently being used in the fabrication of metal oxide semiconductor field effect transistors (MOSFETs) due to the general poor quality of germanium oxide.

Advances in Si technology have lead to the introduction of high-k dielectrics (having a dielectric constant greater than $SiO_2$) as the MOSFET gate insulator. The high-k dielectrics are also expected to be usable with Ge, thus removing the main obstacle in realizing a Ge-based FET. In addition to having high electron and hole mobility, germanium has other advantages such as lower contact resistance and lower dopant activation temperatures than those required by silicon, thus facilitating the formation of shallow junctions.

The higher device performance obtained with silicon-on-insulator (SOI) substrates can also be obtained with germanium-on-insulator (GOI) substrates. Additionally, since current fabrication labs are equipped with tools designed to handle Si substrates, it is desirable that GOI stacks be formed on a Si wafer.

Germanium can also be used to realize fast optical detectors for commonly used wavelengths such as 1.3 microns and 1.55 microns. A Ge photodiode implemented on a GOI substrate can be designed to have lower parasitics, and higher quantum efficiency at a given wavelength. In such a structure, it is possible to replace the insulator with an insulating Bragg mirror that can further increase the photodetector responsively. Since Si is transparent at these wavelengths, backside illumination of a Si wafer having a Ge diode is possible.

The poor quality of germanium oxide makes it difficult to bond Ge to $SiO_2$ by direct bonding since the adhesion between Ge and $SiO_2$ is poor. Another limiting factor for consideration with germanium oxides is that Ge has a relatively low melting temperature (approximately 937° C.), which forces one to use low bonding temperatures (on the order of about 650° C. or less). A still other problem with germanium oxides is that germanium oxides are soluble in water therefore during cleaning in an aqueous media germanium oxide can be removed.

One possible approach for fabricating GOI substrates is to use the SMARTCUT technique described by Colinge, J-P, Silicon-on-Insulator Technology, $2^{nd}$ Ed., Kluwer Academic Publishers, 1997. In the SMARTCUT technique, a thin Ge layer is transferred from a Ge wafer (i.e., the donating wafer) onto a handle wafer. The Ge wafer typically includes a hydrogen implant region formed therein. The Ge wafer is bonded to a handle wafer and an annealing step is performed to strengthen the initial bond and to obtain blistering at the depth of the hydrogen implant. As a result, the Ge layer separates from the donating Ge wafer and remains bonded to the handle wafer. The donating Ge wafer is not lost after bonding and can be used many times for further bonding as the source of the GOI substrate material.

Despite the capability of using the SMARTCUT approach in fabricating GOI substrate materials, the above problems with germanium oxides is still prevalent. Hence, there is a need for providing a new and improved method for fabricating Ge-on-insulator substrate materials that avoids the formation of germanium oxides.

SUMMARY OF THE INVENTION

The present invention provides a method for fabricating GOI substrate materials, the GOI substrate materials produced by the method and various structures that can include at least the GOI substrate materials of the present invention.

It is noted that the term "GOI substrate material" is used in the present invention to denote a structure that includes at least a semiconducting or non-semiconducting substrate, a buried insulator layer located atop the substrate, and a Ge-containing layer, preferably pure Ge, located atop the buried insulator layer. In the GOI substrate materials of the present invention, the Ge-containing layer may also be referred to as the GOI film. The GOI film is the layer of the inventive substrate material in which devices can be formed.

Specifically, and in a first aspect of the present invention, a method for fabricating a single crystal GOI substrate material is described. The method of the present invention includes the use of an intermediate adhesion layer between the Ge-containing layer and the buried insulator layer. The presence of the intermediate adhesion layer improves the bonding strength of the Ge-containing layer to the underlying buried insulator layer. Without such an intermediate adhesion layer, the bonding between the Ge-containing layer and the buried insulator layer is typically poor. This is especially the case, if the Ge-containing layer is bonded to $SiO_2$.

In one embodiment of the present invention, surface roughening can also be employed in the present invention to increase the bond energy between the Ge-containing layer and the buried insulator layer. This approach permits the direct bonding of the Ge-containing layer to the buried insulator layer. The surface roughening approach may be used with, or without, the presence of an intermediate adhesion layer.

In a second aspect of the present invention, a GOI structure is provided. The inventive GOI structure includes a Ge-containing layer that is bonded to a buried insulator layer by an intermediate adhesion layer. Hence, the GOI structure of the present invention includes a buried insulator layer, an intermediate adhesion layer located on an upper surface of the buried insulator layer, and a Ge-containing layer located on an upper surface of the adhesion layer. The buried insulator layer is located on an upper surface of a semiconducting or non-semiconducting substrate.

In a third aspect of the present invention, a GOI structure in which a Ge-containing layer is in direct contact with a buried insulator layer is provided. In this aspect of the present invention, and in order to increase the bond energy between the Ge-containing layer and the buried insulator layer, the Ge-containing surface of a donor Ge wafer which is to be bonded to the buried insulator layer is roughened prior to bonding with the buried insulator layer. In some embodiments of the present invention, an intermediate adhesion layer may be located between the roughened Ge-containing surface and the buried insulator layer.

In a fourth aspect of the present invention, a GOI structure that incorporates a buried Bragg mirror is disclosed. This structure of the present invention can be used as an intermediate structure for fabricating a Ge-containing photodetector such as, for example, a p-i-n photodiode. When the Ge-containing photodiode is illuminated from the top, absorbed photons are converted into a photocurrent. The photons that are not absorbed in the first pass through the detector are reflected back from the buried Bragg mirror and make a second pass through the Ge-containing photodiode. The effective absorption thickness of the Ge-containing photodiode is therefore increased. The Bragg mirror employed in the inventive GOI structure comprises at least two (or more) alternating pairs of dielectric films, each dielectric film of the alternating pair having a different refractive index. The Bragg mirror can also serve as an electrical insulator in such GOI structures.

In a fifth aspect of the present invention, a GOI structure that incorporates a buried diffusive mirror is provided. In such a GOI structure, the diffusive mirror is located between two insulating layers. The diffusive mirror reduces the wavelength dependency (Etalon effect) that is a characteristic of a Bragg mirror.

In a sixth aspect of the present invention, a wafer with a monolithic Ge-on-insulator photodetector and a monolithic Si-containing circuit is provided. The monolithic integration of the Ge-containing photodetector and a circuit such as an amplifier eliminates packaging issues and allow parallel optical communication channels to be realized by forming detector arrays.

In a seventh aspect of the present invention, a SiGe-on-insulator structure and a method to form the same by thermal mixing is provided. In such a process, a Ge-containing layer is first formed atop a Si layer that is located atop a barrier layer that is resistant to Ge diffusion. A heating step is then performed at a temperature that permits interdiffusion of Ge throughout the Si layer and the Ge-containing layer thereby forming a substantially relaxed, single crystal SiGe layer atop the barrier layer. It is noted that the substantially relaxed, single crystal layer is comprised of a homogeneous mixture of the Ge-containing layer as well as the Si layer.

DETAILED DESCRIPTION OF THE INVENTION

Figure 1:
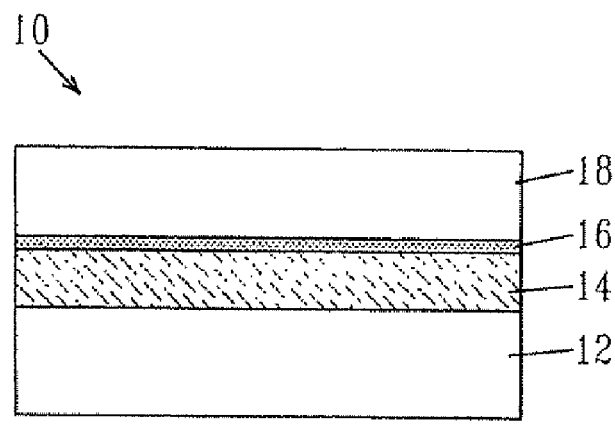
FIG. 1 is a pictorial representation (through a cross sectional view) illustrating a germanium-on-insulator (GOI) wafer of the present invention in which an intermediate adhesion layer is used to obtain a strong bond between the Ge-containing layer and the buried insulator film.

The present invention, which provides a method of fabricating a germanium-on-insulator (GOI) substrate material, the GOI substrate material itself, and structures including the GOI substrate material, will now be described in greater detail by referring to the following discussion together with the drawings that accompany the present application. In the accompanying drawings, like and/or corresponding elements are referred to by like reference numerals.

It is emphasized that the drawings of the present invention are not drawn to scale. For example, the roughened surfaces shown in the drawings are exaggerated for illustrative purpose. In reality, the roughened surfaces would be microscopic and would not be visible to the naked eye.

Reference is first made to FIG. 1, which illustrates one possible Ge-on-insulator (GOI) substrate material 10 of the present invention. Specifically, the GOI substrate material 10 comprises a substrate 12, a buried insulator layer 14 located on an upper surface of the substrate 12, an intermediate adhesion layer 16 located on an upper surface of the buried insulator 14 and a Ge-containing layer 18 located on an upper surface of the intermediate adhesion layer 16.

In some embodiments, substrate 12 comprises any semiconducting material including, for example, Si, SiC, SiGe, SiGeC, Ge, GaAs, InAs, InP as well as other III/V or II/VI compound semiconductors. Preferably, the substrate 12 is a Si-containing substrate. The term "Si-containing substrate" is used throughout the present application to denote a semiconductor material that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The substrate 12 may incorporate a combination of strained and unstrained layers. The substrate 12 may be of any crystallographic orientation, including, for example, (110), (111), or (100).

In some embodiments of the present invention, substrate 12 is a non-semiconducting material. In such an instance, substrate 12 can be composed of Si, glass, sapphire or other like non-semiconducting substrates.

The thickness of the substrate 12 employed in the present invention may vary depending on the ultimate use of the GOI substrate material. Generally, the substrate 12 has a thickness that is greater than the thickness of the buried insulator layer 14 or the Ge-containing layer 18. For example, the substrate 12 of the GOI substrate material 10 has a thickness from about 100 microns to about 2000 microns, with a thickness from about 500 microns to about 900 microns being more typical for 200 mm diameter wafers.

The buried insulator layer 14 employed in the present invention includes, but is not limited to: crystalline or non-crystalline oxides and/or nitrides. In some embodiments of the present invention, the buried insulator layer 14 is a barrier layer that is highly resistant to Ge diffusion. In yet other embodiment of the present invention, the buried insulator layer 14 is $SiO_2$.

The thickness of the buried insulator layer 14 employed in the present invention may vary depending on the type of process used in forming the layer as well as the type of insulator used. Typically, the buried insulator layer 14 of the GOI substrate material 10 has a thickness from about 1 nm to about 1000 nm, with a thickness from about 50 nm to about 200 nm being more typical.

The intermediate adhesion layer 16 is used in some embodiments of the present invention to obtain a strong bond between the Ge-containing layer 18 and the buried insulator layer 14. The intermediate adhesion layer 16 that is employed in the present invention includes any material which is compatible with both the Ge-containing layer and the buried insulator layer, yet forms a strong bond between those two layers. Illustrative examples of such materials that can be utilized as the intermediate adhesion layer 16 include, but are not limited to: Si materials such as single crystal Si, polycrystalline Si, amorphous Si (a:Si), epitaxial Si (epi-Si), SiC, and combinations including multilayers thereof. It should be noted that when a:Si is used the annealing steps described below will convert the majority of the a:Si layer into a polycrystalline layer.

The intermediate adhesion layer 16 can have a variable thickness so as long the intermediate adhesion layer 16 is capable of forming a bond between the overlying Ge-containing layer 18 and the underlying buried insulator layer 14. Typically, the intermediate adhesion layer 16 has a thickness from about 0.5 nm to about 500 nm, with a thickness from about 1 nm to about 10 nm being more typical.

In embodiments wherein $SiO_2$ is used as the buried insulator layer 14, the intermediate adhesion layer 16 is typically a thin silicon film. In such an instance, silicon forms a strong bond with the buried $SiO_2$ insulator 14 on one surface and a strong bond with the Ge-containing layer 18 on the other surface.

The use of the intermediate adhesion layer 16 solves two main problems in forming GOIs: (1) Ge forms a poor quality oxide which is also soluble in water, and (2) The Ge low melting temperature forces low-temperature bonding. For example, when a silicon film is used as the intermediate adhesion layer 16 and when $SiO_2$ is used as the buried insulator layer 14, bonding takes place between a silicon surface and a $SiO_2$ surface. The Si—$SiO_2$ bonding can be done reliably at low temperatures (<600° C.).

Moreover, since the intermediate adhesion layer 16 is in intimate contact with the Ge-containing layer 18, no Ge oxide is present in the structure. This eliminates any processing problems when the structure is later patterned to form devices. Additionally, with GOI MOSFETs where a thin GOI film is required, the elimination of Ge-oxide circumvents the presence of interface states and charge at the Ge/insulator interface. The existence of such charge in proximity to the device would have led to an undesirable threshold voltage (Vt) shift in the GOI MOSFET.

The Ge-containing layer 18 of the GOI substrate material 10 includes any Ge material that does not form a strong bond with an insulator material. Thus, the Ge-containing layer 18 may be a SiGe alloy layer or a pure Ge layer. The term "SiGe alloy layer" includes SiGe alloys that comprise from up to about 99.99 atomic percent Ge, whereas pure Ge includes layers that comprise 100 atomic percent Ge. However, both SiGe alloys and pure Ge may contain impurities, also known as dopants, in order to control the film's conductivity type, or form an electronic structure such as a p-n junction. In a preferred embodiment of the present invention, the Ge-containing layer 18 includes pure Ge. In another preferred embodiment of the present invention, the Ge-containing layer 18 is a SiGe alloy wherein the content of Ge is from about 10% or greater.

The thickness of the Ge-containing layer 18 employed in the present invention may vary depending on the type of process used in forming the layer as well as the type of Ge material used. Typically, for MOSFETs fabrication the Ge-containing layer 18 of the GOI substrate material 10 has a thickness from about 3 nm to about 100 nm, with a thickness from about 5 nm to about 30 nm being more typical. For a Ge photodetector application, the Ge-containing layer 18 has a typical thickness from about 100 nm to about 2000 nm. In the Ge photodetector embodiment, the film thickness is primarily determined by the absorption length of light in Ge. For example the absorption lengths of light having wavelengths of 1300 nm and 850 nm in Ge are 1340 nm and 298 nm, respectively.

The compositional make-up as well as the other physical characteristics of each of the layers shown in FIG. 1 are also applicable in the remaining drawings.

Figure 2:
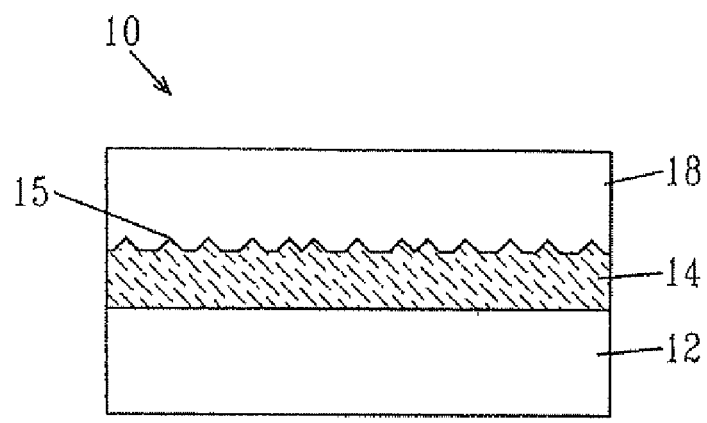
FIG. 2 is a pictorial representation (through a cross sectional view) illustrating a germanium-on-insulator (GOI) wafer of the present invention in which a surface of a Ge-containing layer is roughened to increase the bond energy between the Ge-containing layer and the buried insulator layer.

In the structure shown in FIG. 2, surface-roughening 15 is used to increase the bond energy between the buried insulator layer 14 and the Ge-containing layer 18. Surface roughening occurs on the microscopic scale therefore it is not visible without the aid of a microscope such as, for example, an atomic force microscope (AFM). Surface roughening can be achieved for example, by sputtering the surface of a Ge donor wafer with argon (Ar) ions. The sputtering will remove native Ge oxide from the surface of the Ge donor wafer, and will roughen the surface. Process details for surface roughening will be provided in more detail hereinbelow.

Figure 3:
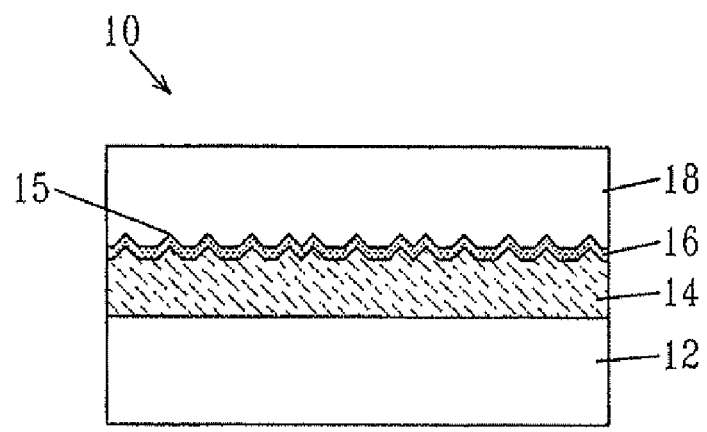
FIG. 3 is a pictorial representation (through a cross sectional view) illustrating a germanium-on-insulator (GOI) wafer wherein both surface roughening and an intermediate adhesion layer are employed.

In some embodiments of the present invention, an intermediate adhesion layer 16 and the roughened surface 15 can be used simultaneously as shown by the Ge-on-insulator (GOI) substrate material 10 shown in FIG. 3.

Figure 4:
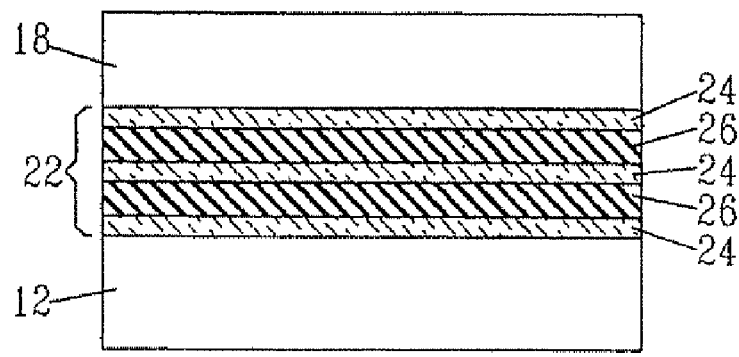
FIG. 4 is a pictorial representation (through a cross sectional view) illustrating a germanium-on-insulator (GOI) wafer of the present invention in which a Bragg mirror is located beneath the Ge-containing layer. In the drawing, the Bragg mirror includes a plurality of two alternating dielectric materials having different refractive indices.
Figure 5:
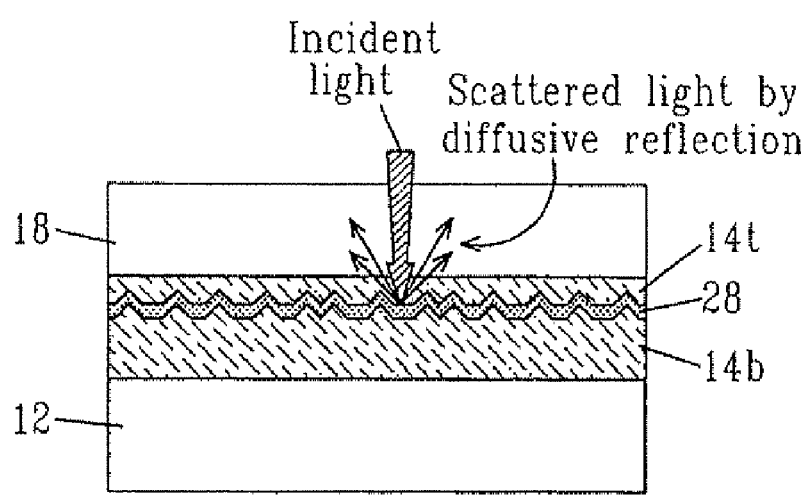
FIG. 5 is a pictorial representation (through a cross sectional view) illustrating a germanium-on-insulator (GOI) wafer of the present invention in which a diffusive mirror is placed under the Ge-on-insulator film; the diffusive mirror is located between two insulator films.
Figure 6:
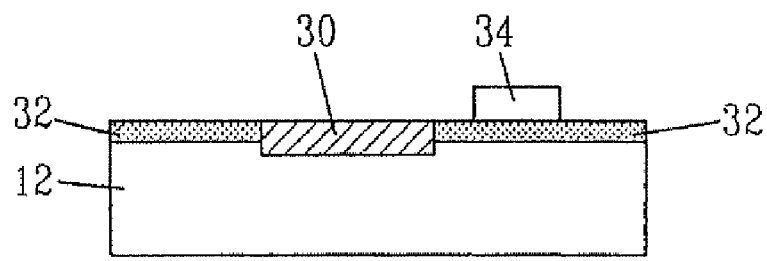
FIG. 6 is a pictorial representation (through a cross sectional view) illustrating a Ge-on-insulator photodetector of the present invention that is monolithically integrated with a Si-containing circuit.

It is noted that FIGS. 1-3 show the basic GOI substrate materials of the present invention. Common to each is that a Ge-containing layer 18 is located atop a buried insulator layer 14. Bonding between the Ge-containing layer 18 and the buried insulator is improved by the presence of the intermediate adhesion layer 16, the surface roughening 15 or both. FIGS. 4-6 show various device applications in which the GOI substrate materials 10 of the present invention can be used. The devices are formed using techniques well known to those skilled in the art.

Specifically, FIG. 4 shows a Ge-on-insulator (GOI) containing structure that can be used for making a Ge photodetector with a buried Bragg mirror 22. The GOI containing structure comprises a substrate 12, a buried Bragg mirror 22, and a Ge-containing layer 18. The Bragg mirror 22, which is used in place of the buried insulator 14 described above in FIGS. 1-3, comprises an alternating pair of dielectric films 24 and 26 having different refractive indices $n_1$ and $n_2$, respectively. The Bragg mirror can also include a half pair comprising one of the alternating dielectric layers. For example, a Bragg mirror with 1.5 pairs is possible; such a Bragg mirror consists of one pair of dielectric films plus one additional dielectric film (similar to that which makes the first layer of the next pair). The drawing shows a Bragg mirror with two and a half pairs.

The dielectric films 24 and 26, which could also be referred to as buried insulator layers, may comprise any dielectric material including for example, oxides, nitrides, and/or oxynitrides. In one embodiment of the present invention, dielectric films 24 and 26 comprise a stack of $SiO_2$ and $Si_3N_4$. It is noted that although the drawings show two pairs of alternating dielectric layers (plus one half of other pair), the present invention contemplates GOI structures wherein a plurality of alternating pairs of dielectrics are used. The number of dielectric pairs formed will affect the mirror's reflectivity. The more pairs are built into the mirror, the higher the mirror's reflectivity will be. As an example, a mirror with 3.5 pairs of $SiO_2$/polysilicon will typically reflect more than 90% of the light at the wavelength of interest.

FIG. 5 shows a Ge-on-insulator (GOI) containing structure that can be used for making a Ge photodetector with a buried diffusive mirror. The GOI containing structure comprises a substrate 12, a buried diffusive mirror 28 that is located between a top and a bottom insulating films 14t and 14b, respectively, and a Ge-containing layer 18. To obtain the diffusive reflection of light, the mirror 28 is corrugated. The buried diffusive mirror can be made of a metal such as tungsten or platinum.

FIG. 6 is shows a monolithically integrated chip that includes a GOI substrate material of the present invention. The chip comprises a Si-containing, e.g., Si or SiGe, circuit 30, an insulator film, e.g., the buried insulator, or a mirror stack 32, and a GOI photodetector 34. By monolithically integrating the photodetector with the Si-containing circuit, the parasitic inductance and capacitance can be reduced as compared with hybrid integration. Additionally, the fabrication of a dense array of detectors is easy to implement by conventional Si/Ge processing.

Figure 7:
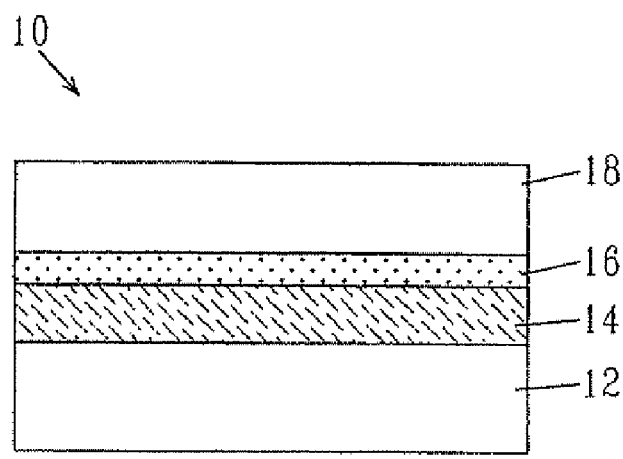
FIG. 7 is a pictorial representation (through a cross sectional view) illustrating a germanium-on-insulator (GOI) wafer of the present invention in which an amorphous silicon layer is located beneath the Ge-containing layer.
Figure 8:
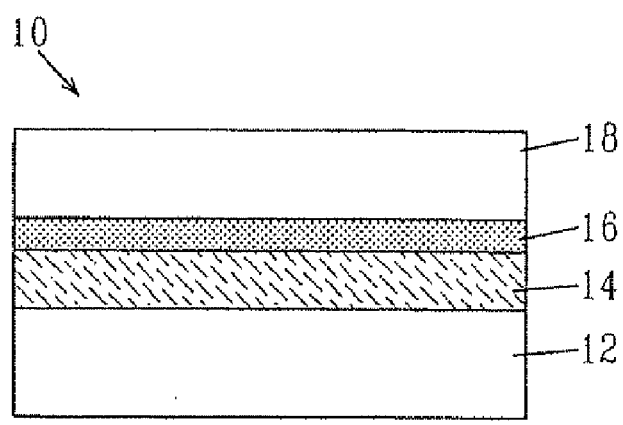
FIG. 8 is a pictorial representation (through a cross sectional view) illustrating a germanium-on-insulator (GOI) wafer of the present invention in which a polysilicon layer is located beneath the Ge-containing layer.

FIGS. 7 and 8 show two examples Ge-on-insulator (GOI) substrate materials 10 that can be transformed into a SiGe-on-insulator wafer (See FIG. 9) by thermal mixing. Specifically, FIG. 7 shows a GOI substrate material 10 that includes a substrate 12, a buried insulator layer 14 located on an upper surface of the substrate 12, an intermediate adhesion layer 16 that is comprised of amorphous silicon located on an upper surface of the buried insulator layer 14, and a Ge-containing layer 18 located on an upper surface of the intermediate adhesion layer 16. Although not shown, surface roughening may be present.

FIG. 8 shows a GOI substrate material 10 that includes a substrate 12, a buried insulator layer 14 located on an upper surface of the substrate 12, an intermediate adhesion layer 16 that is comprised of polysilicon located on an upper surface of the buried insulator layer 14, and a Ge-containing layer 18 located on an upper surface of the intermediate adhesion layer 16. Although not shown, surface roughening may be present.

Using thermal mixing, the wafers can be converted into a SiGe-on-insulator (SGOI) wafer or Ge-on-insulator (GOI) wafer without any silicon layer left at the interface. To convert the silicon adhesion layer to a Ge rich SGOI (FIG. 9), the GOI structures (FIG. 7-8) are annealed in an inert ambient. To obtain a silicon free GOI structure, the wafers (FIGS. 7 and 8.) are annealed in an oxygen containing inert ambient. In the later case, the silicon films will be oxidized leaving a pure Ge layer on oxide (insulator). The annealing temperature required for thermal mixing is close to the melting point of the system and is determined by the ratio of the silicon and germanium elements.

Figure 9:
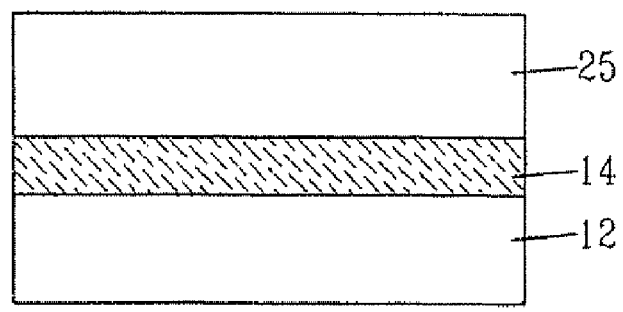
FIG. 9 is a pictorial representation (through a cross sectional view) illustrating a SiGe-on-insulator (SOI) wafer of the present invention which is formed by thermal mixing.

In FIG. 9, reference numeral 12 represents the substrate, reference numeral 14 represents the buried insulator layer, and reference numeral 25 is the substantially relaxed SiGe alloy layer.

In the thermal mixing process, the heating step is performed at a temperature that permits interdiffusion of Ge throughout the Si adhesion layer and the Ge-containing layer thereby forming a substantially relaxed, single crystal SiGe layer atop the buried insulator layer. It is noted that the substantially relaxed, single crystal layer is comprised of a homogeneous mixture of the Ge-containing layer 18 as well as the Si layer 16.

A complete discussion of the thermal mixing process as well as the conditions that can be used in the present invention to cause thermal mixing can be found, for example, in co-pending and co-assigned U.S. patent application Ser. No. 10/055,138, entitled "Method of Creating High-Quality Relaxed SiGe-on-Insulator for Strained Si CMOS Applications", filed Jan. 23, 2002, co-pending and co-assigned U.S. patent application Ser. No. 10/037,611, entitled "Method For Fabrication of Relaxed SiGe Buffer Layers on Silicon-on-Insulators and Structures Containing the Same", filed Jan. 4, 2002; U.S. patent application Ser. No. 10/448,948 entitled "High Quality SGOI by Annealing Near the Alloy Melting Point", filed May 30, 2003; and co-pending and co-assigned U.S. patent application Ser. No. 10/448,954, entitled "SiGe Lattice Engineering Using a Combination of Oxidation, Thinning and Epitaxial Regrowth", filed May 30, 2003. The entire contents of each of the aforementioned references which describe thermal mixing and conditions that can be employed for achieving the same are incorporated herein by.

The basic processing steps employed in the present invention for fabricating the GOI substrate material of FIG. 3 will now be described in greater detail with reference to FIGS. 10 to 17. Despite showing and describing the embodiment wherein both surface roughening and an intermediate adhesion layer are employed, the method below can be slightly modified by either eliminating the surface roughening step or by eliminating the adhesion layer to provide the GOI materials shown in FIGS. 1 and 2. The various structure described above can use the same basic processing scheme together with known techniques for forming each of the above mentioned devices.

Figure 10:
FIGS. 10-17 are pictorial representations (through cross sectional views) illustrating the basic processing steps that are employed in forming the Ge-on-insulator wafer as shown in FIG. 3.
Figure 11:
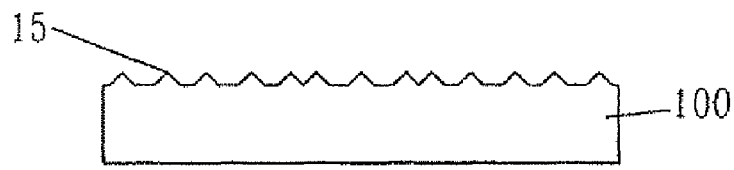

FIG. 10 shows the initial Ge-containing donating wafer 100 that can be employed in the present invention. A portion of this initial Ge-containing donating wafer 100 will be used as the Ge-containing layer 18 in the final GOI substrate material 10. One surface of the donating Ge-containing wafer 100 is roughened utilizing techniques well known to those skilled in the art. For example, surface roughening can be achieved by sputtering in argon or any other inert gas. The sputtering removes native oxide from the initial Ge-containing wafer 100 and also roughens the surface 15 as shown in FIG. 11. The surface-roughening step is optional and is not employed in all embodiments of the present invention.

Figure 12:
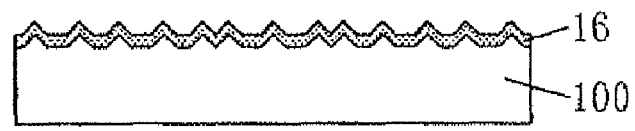

An intermediate adhesion layer 16 such as Si is then formed over the sputtered cleaned Ge surface providing the structure shown in FIG. 12. The formation of the intermediate adhesion layer 16 is typically carried in the same chamber as the sputter clean without breaking vacuum.

Illustrative examples of methods that can be used in forming the intermediate adhesion layer 16 include any known deposition process such as, for example, chemical vapor deposition, physical vapor deposition, plasma enhanced chemical vapor deposition, epitaxial growth, chemical solution deposition, atomic layer deposition, evaporation, sputtering and the like. The intermediate adhesion layer 16 thickness is typically about 10 nm but can be made thicker or thinner based on the application. For example, to convert GOI layer to a SGOI layer by thermal mixing a thicker adhesion layer 16 is typically required. In some embodiments, the intermediate adhesion layer 16 is optional.

Figure 13:

A buried insulator layer 14 is formed on a surface of the adhesion layer 16 providing the structure shown, for example, in FIG. 13. As stated above, the buried insulator layer 14 may be an oxide or nitride, with oxides such as $SiO_2$ being more preferred. The buried insulator layer 14 can be formed by a deposition process such as, for example, chemical vapor deposition, physical vapor deposition, plasma enhanced chemical vapor deposition, chemical solution deposition, or atomic layer deposition, evaporation. Alternatively, the buried insulator layer 14 can be formed by a thermal oxidation or nitridation process. The formation of the buried insulator layer 14 is typically done in the same chamber as the adhesion layer 16 without breaking vacuum. Additional films can be deposited, for example, to realize a dielectric Bragg mirror. It is also possible to form the diffusive mirror at this point of the present invention.

In some embodiments of the present invention, an optional low-temperature-oxide (LTO) (not shown in the drawings) can be formed over the film stack shown in FIG. 13. The LTO film is used in some embodiments as a "glue" between the film stack of FIG. 13 and the substrate 12. The LTO is formed utilizing a deposition process such as, for example, chemical vapor deposition, physical vapor deposition, plasma enhanced chemical vapor deposition, chemical solution deposition, atomic layer deposition, or evaporation. When present, the LTO film is typically annealed at a temperature from about 400° C. to about 650° C. to densify the LTO.

It is noted that the various depositions discussed herein do not need to take place in the same chamber, but are more likely to be performed in a cluster tool with specialized chamber for each deposition etching, or cleaning step.

Figure 14:
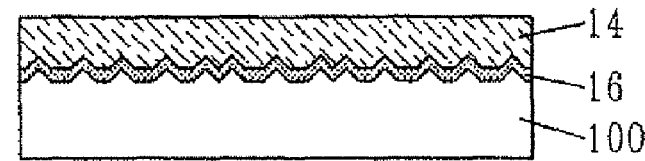

The exposed surface of the buried insulator layer 14 or the optional LTO film is then polished by a conventional planarization process such as, for example, chemical mechanical polishing (CMP), to obtain a smooth surface as shown in FIG. 14. A smooth surface is typically required for fusion bonding. It is emphasized that in FIG. 14, the planarization process smoothes the exposed surface of the buried insulator layer 14.

The structure shown in FIG. 14 is then implanted with hydrogen ($H^+$) 102 to create a hydrogen ion rich profile in the structure. The structure during the hydrogen implant process is shown, for example, in FIG. 15. The dose of the hydrogen implant step is typically from about 1E15 $cm^{-2}$ to about 1E17 $cm^{-2}$, with a hydrogen ion dose from about 3E16 to about 4E16 $cm^{-2}$ being more typical. The implant energy defines the thickness of the transfer layer. For example, to transfer a 360 nm thick Ge film requires a $H_2$ implant energy of about 100 keV. The hydrogen implant is typically performed at an implant temperature from about 0° C. to about 100° C., with an implant temperature from about 20° C. to about 40° C. being more typical. The implant energy determines the thickness of the Ge-containing layer 18 that will be transferred from the Ge-containing wafer 100. The implant conditions are such that the hydrogen ion rich implant region is formed within the Ge-containing wafer 100.

Figure 15:
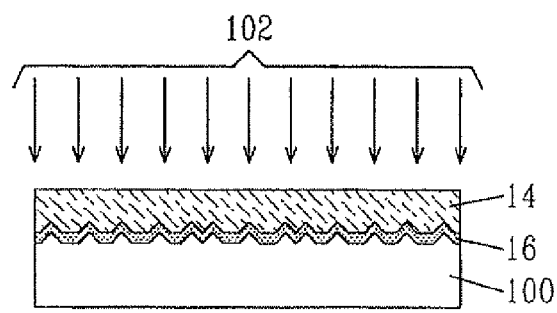
Figure 16:
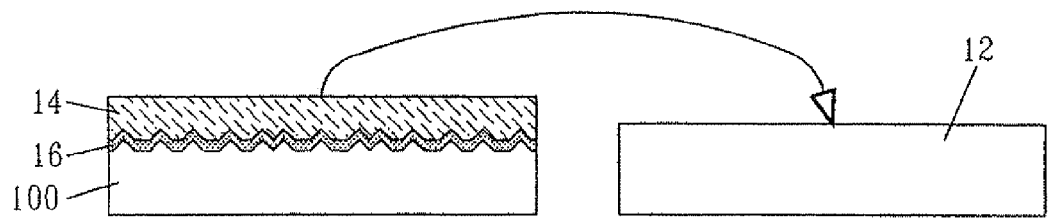

The polished surface of the structure shown in FIG. 15, i.e., the buried insulator layer 14, as well as a substrate 12 are then cleaned and surface treated utilizing techniques well known to those skilled in the art. The surface treatment may include treating both or only one surface with a hydrophilic or hydrophobic agent. The Ge wafer 100 is flipped and positioned atop the substrate 12. The arrow in FIG. 16 shows the direction of the flipping step. In accordance with the present invention, the cleaned and treated structure of FIG. 15 is flipped atop the substrate 12 such that the exposed surface of the buried insulator layer 14 will be on top of a surface of the substrate 12.

The bonding process employed in the present invention includes contacting the two wafers at nominal room temperature in the presence or absence of an external force. By "nominal room temperature" it is meant a temperature from about 20° C. to about 40° C. To further strengthen the bonding and to cause the desired split off a portion of the Ge-containing donor wafer the following anneals may be performed:

Initially, a first anneal at a first temperature that enhances bonding between the substrate 12 and the buried insulator layer 14 is performed. Specifically, the first anneal is typically performed at a temperature from about 100° C. to about 300° C., with a first annealing temperature from about 200° C. to about 250° C. being more typical. The first anneal is typically carried out in an inert gas ambient such as He, $N_2$, Ar, Ne, Kr, Xe and mixtures thereof In some embodiments, the inert gas ambient may be diluted with an oxygen-containing gas. The first anneal is typically performed for a time period from about 1 hour to about 48 hours, with a time period from about 3 hours to about 24 hours being more typical. The first anneal may be carried out using a single ramp-up rate to a desired targeted temperature within the range mentioned above, or alternatively various ramp and soak cycle, with or without altering the ambient gas, may be performed.

Following the first anneal, a second anneal at second temperature which is capable of the splitting 110 the donating Ge-containing wafer 100 leaving behind a Ge-containing layer 18 of an appropriate thickness is performed. The second anneal is typically performed at a temperature from about 250° C. to about 400° C., with a second annealing temperature from about 300° C. to about 375° C. being more typical. The second anneal is typically carried out in an inert gas ambient such as He, $N_2$, Ar, Ne, Kr, Xe and mixtures thereof The second annealing ambient may be the same or different than the ambient used in the first anneal. In some embodiments, the inert gas ambient may be diluted with an oxygen-containing gas. The second anneal is typically performed for a time period from about 1 hour to about 24 hours, with a time period from about 2 hours to about 6 hours being more typical. The second anneal time depends on the anneal temperature and implantation dose used. The second anneal may be carried out using a single ramp-up rate to a desired targeted temperature within the range mentioned above, or alternatively various ramp and soak cycle, with or without altering the ambient gas, may be performed.

A third anneal at a third temperature which is capable of further strengthen the bonding between the buried insulator layer 14 and the substrate 12 follows the second anneal. The third anneal is typically performed at a temperature from about 500° C. to about 900° C., with a third annealing temperature from about 500° C. to about 850° C. being more typical. The third anneal is typically carried out in an inert gas ambient such as He, $N_2$, Ar, Ne, Kr, Xe and mixtures thereof. The third gas ambient may be the same or different than any of the previously used ambients. In some embodiments, the inert gas ambient may be diluted with an oxygen-containing gas. The third anneal is typically performed for a time period from about 1 hour to about 48 hours, with a time period from about 2 hours to about 5 hours being more typical. The third anneal may be carried out using a single ramp-up rate to a desired targeted temperature within the range mentioned above, or alternatively various ramp and soak cycle, with or without altering the ambient gas, may be performed.

Figure 17:
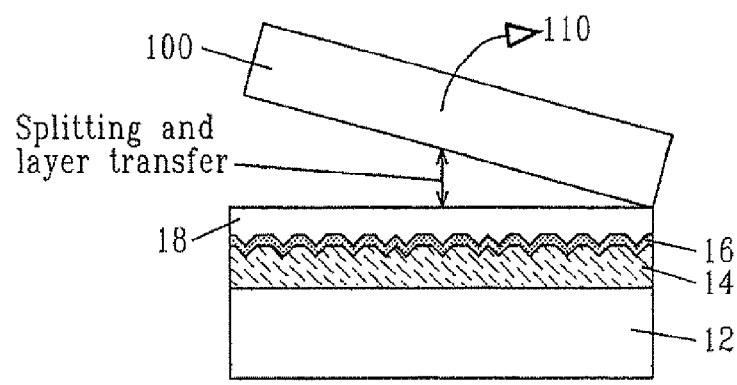

FIG. 17 shows the structure during the second anneal in which a portion of the Ge-containing wafer is split off. The split off occurs within the hydrogen ion implant rich region leaving behind a Si-containing layer 18. The top arrow 110 attached to a portion of the Ge-containing donor wafer 100 shows the split off.

After annealing, the Ge-containing layer 18 may be optionally polished by CMP at this stage of present invention. The final resultant structure is shown in FIG. 3.

Figure 18:
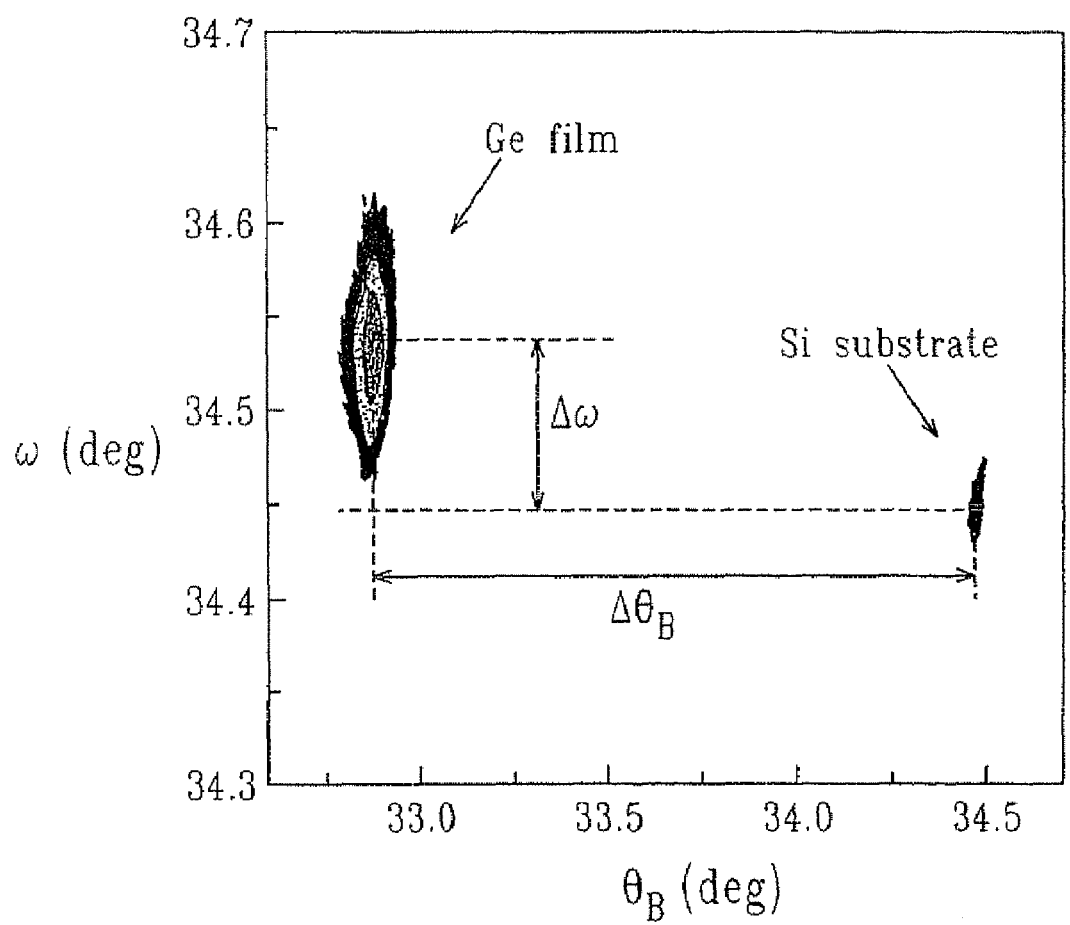
FIG. 18 is a triple-axis x-ray diffraction map of a bonded Ge-on-insulator wafer formed by the method of the present invention; $\omega$ is the angle between the incident beam and the sample surface and $2\theta_B$ is the angle between the detector (diffracted beam) and the incident beam, i.e., it is twice the Bragg angle $\theta_B$.

FIG. 18 shows a high resolution x-ray diffraction map of a GOI sample which was fabricated using the method outlined above. The map shows a diffraction peak from the silicon substrate and another diffraction peak from the single-crystal Ge film. The two peaks are separated by an angular spacing $\Delta\theta_B$. This angular separation indicates that the Ge film maintained its bulk constant lattice (i.e. it is not strained) after it was transferred onto the Si wafer. Being a thin film, the Ge diffraction peak is broader than that of the silicon substrate as expected. Note that there is an offset ($\Delta\omega$) between the diffraction peaks, indicating a slight misalignment between the (001) lattice planes of the substrate and those of the bonded GOI layer. This misalignment is due to an unintentional wafer miscut and is a typical signature of structures formed by wafer bonding.

While the present invention has been particularly shown and described with respect to preferred embodiments thereof; it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for forming a germanium-on-insulator comprising:
   roughing a surface of a Ge-containing donor substrate, said roughing comprises sputtering in an inert gas;
   forming an intermediate adhesion layer on the roughened surface of the Ge-containing donor substrate;
   forming a buried insulator layer on said intermediate adhesion layer;
   implanting hydrogen into said Ge-containing donor substrate; and
   bonding an exposed surface of the buried insulator layer to a semiconducting or non-semiconducting substrate, wherein during said bonding a portion of the Ge-containing donor substrate is transferred to said substrate.

2. The method of claim 1 wherein the Ge-containing donor substrate is a pure Ge wafer.

3. The method of claim 1 wherein the implanting is performed using a hydrogen dose from about $1E15$ cm$^{-2}$ to about $1E17$ cm$^{-2}$.

4. The method of claim 1 wherein said bonding comprises wafer flipping, contact bonding and annealing.

5. The method of claim 4 wherein said annealing comprises a first anneal at first temperature that is capable of enhancing bonding between the substrate and the buried insulator layer; a second anneal at a second temperature that is capable of said removing a portion of the Ge-containing donor layer; and a third anneal at a third temperature that is capable of further strengthening bonding.

6. The method of claim 5 wherein the first temperature of said first anneal is from about 100° C. to about 300° C. for a time period from about 1 hour to about 48 hours.

7. The method of claim 5 wherein the second temperature of the second anneal is from about 250° C. to about 400° C. for a time period from about 1 hour to about 24 hours.

8. The method of claim 5 wherein the third temperature of the third anneal is from about 500° C. to about 900° C. for a time period from about 1 hour to about 48 hours.

9. The method of claim 5 wherein the first, second and third anneals are performed in the same or different inert gas ambient that may optionally be diluted with an oxygen-containing gas.

10. The method of claim 1 further comprising performing a chemical mechanical polishing step between said forming the buried insulator layer and said implanting hydrogen.

* * * * *